United States Patent
Yang et al.

(10) Patent No.: US 8,239,731 B1
(45) Date of Patent: Aug. 7, 2012

(54) METHODS AND APPARATUS FOR PROVIDING MULTILEVEL COSET CODING AND PROBABILISTIC ERROR CORRECTION

(75) Inventors: Xueshi Yang, Sunnyvale, CA (US); Gregory Burd, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 1065 days.

(21) Appl. No.: 12/168,586

(22) Filed: Jul. 7, 2008

Related U.S. Application Data

(60) Provisional application No. 60/948,302, filed on Jul. 6, 2007.

(51) Int. Cl.
*G11C 29/00* (2006.01)
(52) U.S. Cl. .................. 714/764; 714/758; 714/766
(58) Field of Classification Search .................. 714/764, 714/758, 766, 781, 703, 52
See application file for complete search history.

(56) References Cited

U.S. PATENT DOCUMENTS

| | | | |
|---|---|---|---|
| 6,473,331 B1 * | 10/2002 | Takashima | 365/145 |
| 7,296,212 B1 * | 11/2007 | Hammons, Jr. | 714/781 |
| 7,886,201 B2 * | 2/2011 | Shi et al. | 714/52 |
| 7,895,502 B2 * | 2/2011 | Han et al. | 714/764 |

* cited by examiner

*Primary Examiner* — Fritz Alphonse

(57) ABSTRACT

Systems and methods are provided for performing multilevel coset coding and probabilistic error correction. Multiple bit data is encoded in a memory by combining one of the bit positions of multiple data values and encoding the combination to form a codeword. A data point containing a bit error is determined by decoding a codeword associated with one of the bit positions. A first coset corresponding to a data point with the error is determined where the coset includes labels representing non-adjacent analog signal levels. Labels in a second coset that includes mutually exclusive labels from the first coset are analyzed to select a label representing a signal level that is closest in proximity to the signal level represented by the data point containing the bit error than the other labels in the second coset. The data point error is corrected by replacing the data point with the selected label.

30 Claims, 13 Drawing Sheets

METHODS AND APPARATUS FOR PROVIDING MULTILEVEL COSET CODING AND PROBABILISTIC ERROR CORRECTION

CROSS REFERENCE TO RELATED APPLICATION

This application claims the benefit of U.S. Provisional Application No. 60/948,302, filed Jul. 6, 2007, which is hereby incorporated by reference herein in its entirety.

BACKGROUND

The present invention is directed to methods and apparatus for providing multilevel coset coding and probabilistic error correction, and more particularly to coding multi-bit data corresponding to an analog signal (e.g., pulse amplitude modulated (PAM) or peak-limited communication system) to maintain data integrity.

Flash memory devices can be used to store multiple bits (e.g., 3 bits) of information in each memory cell. This can be done by, for example, programming one of multiple levels of charge in an isolated region of the memory cell (e.g., a floating gate). In particular, a cell that is used to store one of eight different signal levels can be used to represent, for example, a three-bit data point. As defined herein the term signal level refers to a charge, voltage, phase status or any other electrical characteristic that is stored and used to represent one or more data points.

Conventional systems use coding schemes to protect data integrity of the information stored in such memory devices. The conventional coding schemes typically encode and decode information on granularity of a data point (e.g., 3-bits) using one or more codes and do not account for the signaling method that is used. In particular, because the digital data points are represented by different signal levels stored in the memory, most errors that occur result from a minimum distance error between two charges. For example, when reading the memory, the read out signal level might be mistaken from an immediate neighbor instead of from a level that is more than one level away. Thus, error correction code (ECC) designed without considering the signaling method may not be optimal.

Accordingly, taking into account signaling methods in memory devices, such as flash memory, becomes critical for optimal ECC design.

SUMMARY

In accordance with the principles of the present invention, methods and apparatus provide multilevel coset coding and probabilistic error correction. In particular, a coding scheme is provided to detect signal level read-out errors by coding on the granularity of data point bits and using a coset tree to correct the detected error.

In one embodiment, an analog signal is received and signal levels corresponding to multiple bit digital data points are stored in a storage device. In one implementation, the storage device is a flash memory device and the analog signal is an 8PAM signal. In particular, the analog signal may contain eight distinct signal levels that may be represented by three bit data points.

A multilevel error detection and correction circuit encodes the information representing the signal levels of the analog signal. The information is encoded on a bit level granularity by combining a number of bits in a particular position of different multiple-bit data points and encoding them using a systematic or non-systematic encoding scheme. In some embodiments, the lower order bits of the multiple bit data points are encoded more strongly (i.e., with more redundancy) than higher order bits. In one implementation, a BCH coding scheme is used to encode the data. In some implementations, the information is encoded as it is received by the receiver and then stored to the memory.

When the data is read, the multilevel error detection and correction circuit decodes the bits of the information that is read to determine whether a signal level bit read error occurs and in which bit position of the read data point the error is present.

Multilevel error detection and correction circuit steps through a coset tree to determine to which coset the data point with the bit error belongs. In some embodiments, the cosets in the coset tree are partitioned according to the bit values in the bit positions of the data points. In one implementation, the coset tree is partitioned beginning with the lowest order bits. The labels (i.e., digital signal level identifiers) in the cosets are provided such that the cosets include labels that represent non-adjacent or non-neighboring signal levels. The multilevel error detection and correction circuit retrieves the labels that belong to the coset at the level corresponding to the bit with the error. The multilevel error detection and correction circuit selects the label which represents the signal level that is closest in proximity to the signal level represented by the data point than all labels in the coset. The bit error is corrected by replacing the data point with the selected label.

BRIEF DESCRIPTION OF THE DRAWINGS

The above and other features of the present invention, its nature and various advantages will be more apparent upon consideration of the following detailed description, taken in conjunction with the accompanying drawings in which.

DETAILED DESCRIPTION

Figure 1:
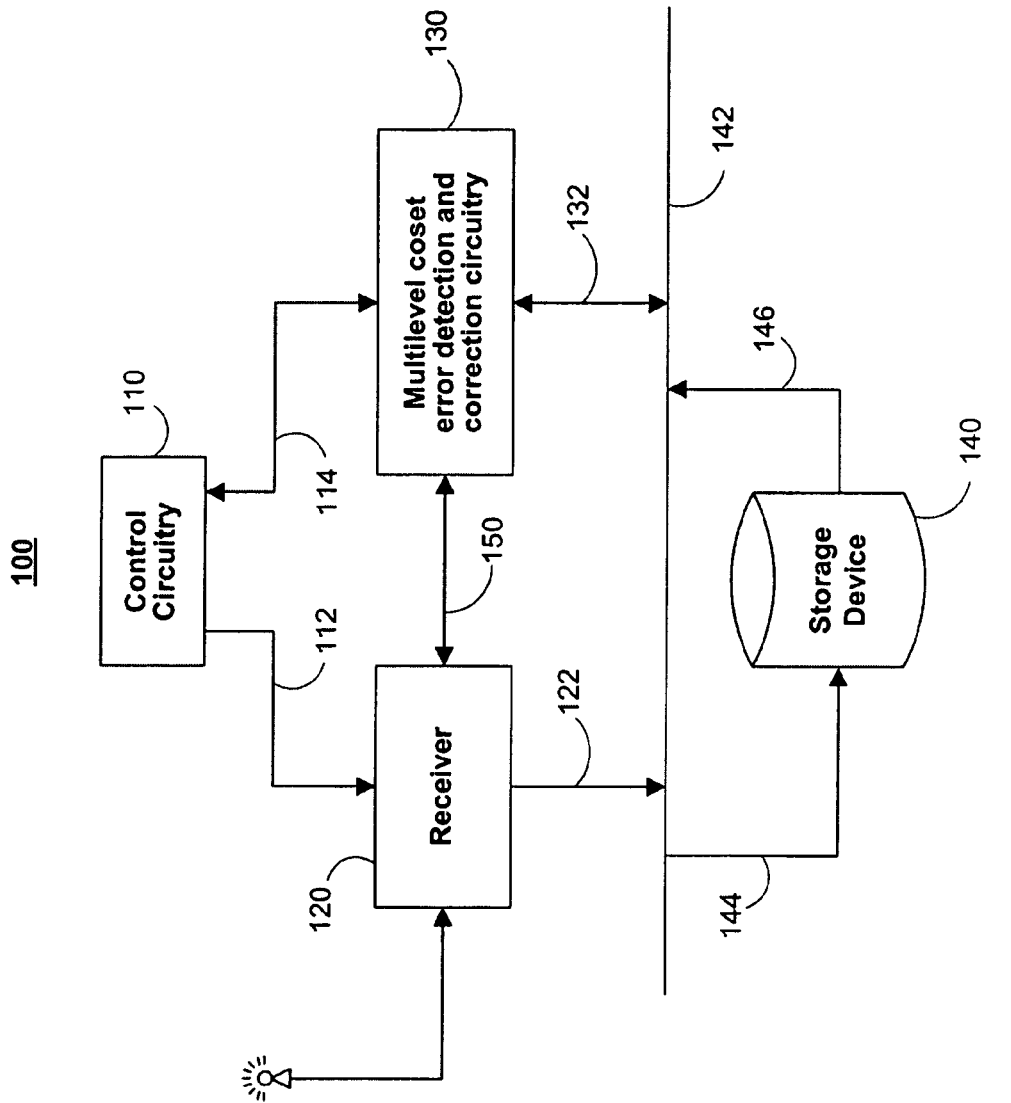
FIG. 1 is a diagram of an illustrative multilevel coset coding and probabilistic error correction system in accordance with an embodiment of the present invention.

FIG. 1 is a diagram of an illustrative multilevel coset coding and probabilistic error correction system 100 in accordance with an embodiment of the present invention. System 100 may include control circuitry 110, receiver 120, multilevel coset error detection and correction circuitry 130, and a storage device 140.

Receiver 120 receives an analog signal and detects the signal level represented by digital values. For example, control circuitry 110 is coupled to receiver 120 via communications link 112 and may provide configuration information for interpreting a received signal. In particular, the received signal may be of a particular frequency such that the signal levels are separated by a particular time period. The configuration information may set the time period of the received signal for the receiver to successfully retrieve the appropriate signal levels to decipher the digital information.

In one implementation, the received signal is an 8PAM signal having eight distinct signal levels. The receiver 120 retrieves each signal level at a particular frequency. Receiver 120 is coupled to storage device 140 through the memory bus 142 and communications link 122. Storage device 140 may be a flash memory device or any other type of storage device that is capable of storing multiple signal levels that represent data points (e.g., 3-bit data point). Receiver 120 writes or stores the retrieved signal level to storage device 140.

When storage device 140 is read, signal level information is provided to the memory bus 142 from the corresponding memory address to control circuitry 110. Control circuitry 110 interprets the signal level that is read out to be a particular data point (i.e., a digital multi-bit value). For example, in an 8PAM implementation, eight signal labels may be provided with 3-bits each that represent eight different stored signal levels. Depending on the signal level that is read out, the corresponding signal label is interpreted to be the data point.

Figure 6:
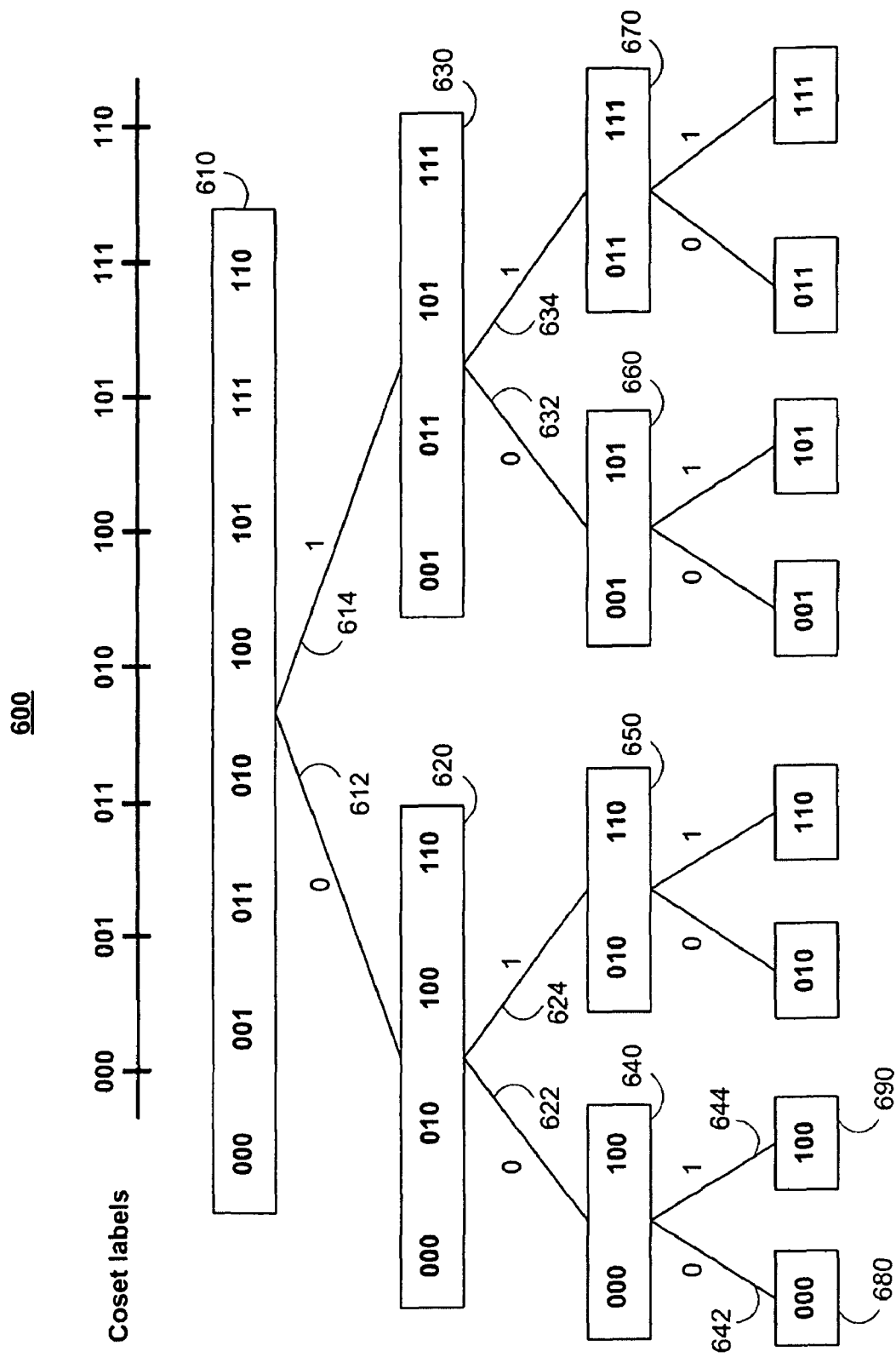
FIG. 6 is a detailed illustration of an exemplary coset tree generated in accordance with an embodiment of the present invention.

In order to correct possible charge-level read errors, the information (i.e., signal levels) stored in storage device 140 is encoded by multilevel coset error detection and correction circuitry 130. In particular, as discussed in more detail below in connection with FIGS. 2 and 3, circuitry 130 partitions the digital values represented by the analog signal constellation into multiple cosets such that each coset contains digital values that represent non-adjacent (or non-neighboring) analog signal levels. For example, in an 8PAM implementation, the analog signal digital values may be labeled as shown in FIG. 6 and the cosets may be partitioned into a coset tree 600 of the form shown in FIG. 6. Coset tree 600 is partitioned into levels that are formed according to the bit positions of the data points (e.g., three levels are formed when the signal levels are represented by 3-bit values).

It should be understood that coset tree 600 is provided for illustrative purposes but any other coset tree may be provided that contains the property that through at least one level of partitioning, the signal constellation (the labels representing the signal signal levels) is partitioned into cosets containing signal points separated by more than the minimum distance of the entire constellation. More specifically, the signal constellation is partitioned into cosets that contain non-adjacent or non-neighboring signal labels. The terms non-adjacent or non-neighboring signal labels mean that the labels of particular signal levels are separated by at least one other unique signal level. For example, if a signal has five signal levels (i.e., −1 V, −0.5 V, 0 V, +0.5 V, and +1 V) and each signal level has a respective signal label (i.e., 000, 001, 010, 100, 101), then 000 and 001 are adjacent because there are no other signal levels between them while 000 is non-adjacent or non-neighboring with 010, 100, and 101. That is, the minimum distance of the entire signal constellation is 0.5 V and thus the cosets contain labels that represent signal signal levels separated by more than 0.5 V.

It should be understood, that the invention is described using an 8PAM analog signal for illustration purposes but the teachings apply to any type of analog signal of any length (e.g., 4PAM or 16PAM) which contains signal levels that can be used to represent a multiple bit data point. It should also be understood, that the invention may be extended to multi-dimensional signal constellations, such as 2×4PAM, which may be formed by Cartesian product of two 4PAM signals.

The digital values represented by the stored signal levels (i.e., stored data points) are encoded to enable a decoder to subsequently determine to which part of the coset tree 600 a data point belongs. For example, in the case of 3-bit data points, the encoder reads the user data to be stored in storage device 140 via communications link 150. The encoder may then group every three bits into a data point and subsequently form a vector of data points. The encoder in circuitry 130 encodes each of the bits in the first position of the data points together to form a first codeword, the bits in the second position of the data points together to form a second codeword and the bits in the third position of the data points together to form a third codeword. Circuitry 130 writes the codewords that are formed by the encoding operation to the storage device 140.

When control circuitry 110 requests that a read operation be performed on storage device 140, the data points and corresponding codewords are passed through circuitry 130 to correct any signal level read errors. In particular, a decoder in circuitry 130 decodes the codewords and determines which bit position of a particular data point contains an error. Additionally, because coset tree 600 is partitioned into levels according to the bit positions of the data points, the decoder can determine at which level and to which corresponding coset of the coset tree 600 the data point with the error belongs. Thus, if an error is found in the second bit position of a data point, the decoder may determine that the data point with the error belongs to one of the cosets in the second level (i.e., either coset 640, 650, 660, or 670).

By determining to which coset in a particular level of coset tree 600 a data point with an error belongs, the circuitry 130 can correct the error by analyzing the signal labels in the other coset at the particular level of the coset tree 600. In particular, circuitry 130 selects a signal label in the other coset that represents a signal level of the analog signal that is closest in proximity to the signal level represented by the data point with the error than the other signal labels in the coset. Circuitry 130 provides the corrected data points that are requested by control circuitry 110 to control circuitry 110 via communications link 114.

As discussed in more detail in connection with FIG. 3, in some implementations, circuitry 130 encodes some codewords with a stronger level of code (i.e., code that generates more redundancy) than others. In particular, lower bit positions of the multiple bit data points may be more susceptible to read errors and thus need more redundancy to prevent errors at higher levels. Reducing the errors at the lower bits may prevent errors at higher levels because bits in lower positions may identify which coset the read out signal belongs to at the higher levels of the partitioning tree (FIG. 6). Additionally, at higher levels less redundancy may be needed because the minimum distance between signals in different cosets (referred to as inter-coset distances) at higher levels of the partitioning tree are smaller compared to that of the lower levels.

Figure 2:
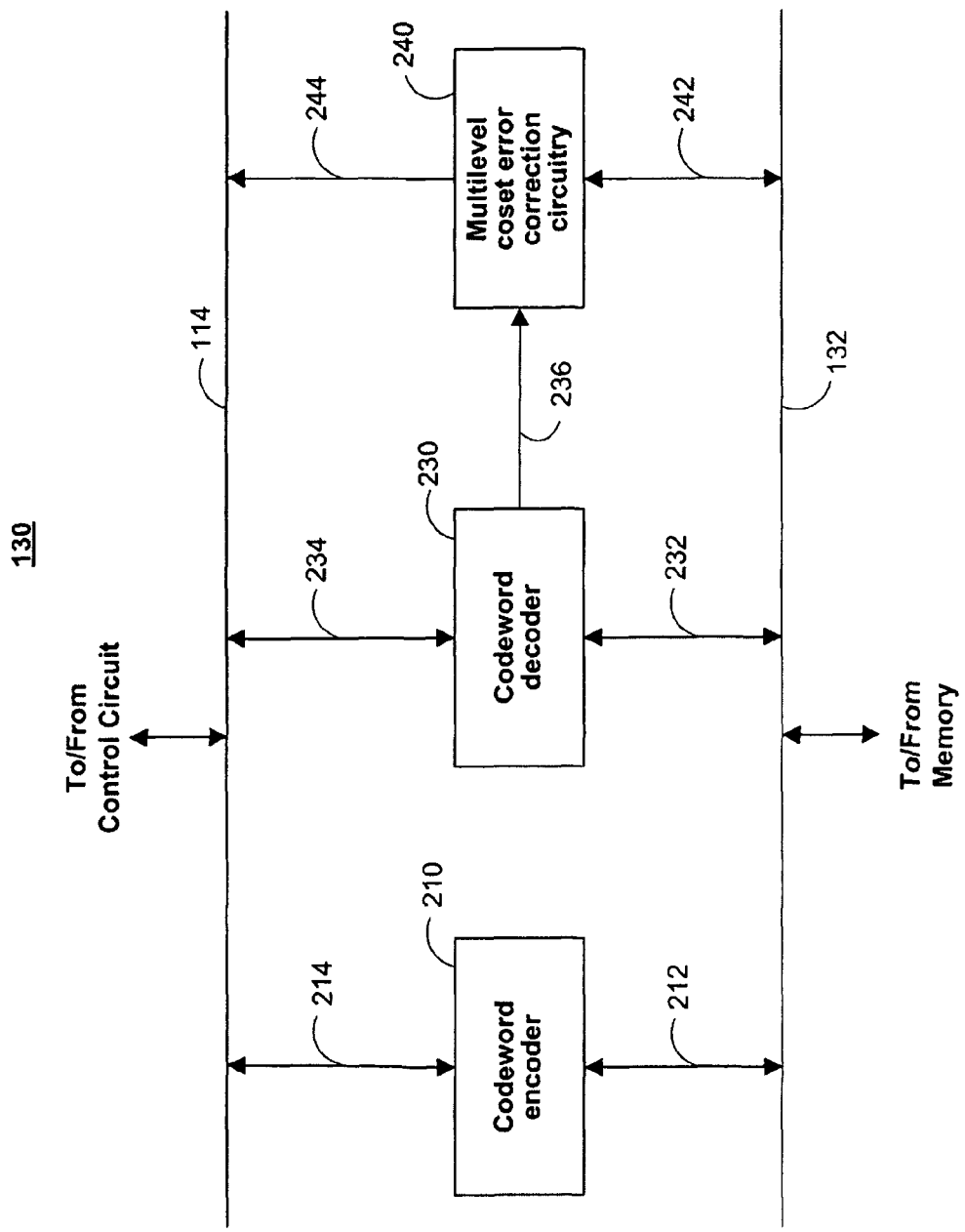
FIG. 2 is a diagram of an illustrative multilevel coset coding and probabilistic error correction circuitry in accordance with an embodiment of the present invention.

FIG. 2 is a diagram of an illustrative multilevel coset coding and probabilistic error correction circuitry 130 in accordance with an embodiment of the present invention. Circuitry 130 includes codeword encoder 210, codeword decoder 230 and multilevel coset error correction circuitry 240. Receiver 120 (FIG. 1) receives user data and encodes the user data via encoder 210. In particular, control circuitry 110 may instruct circuitry 130 to perform an encoding operation via communications link 114 and provide any necessary parameters.

For example, control circuitry 110 may provide the codeword encoder 210 with instructions on how strongly (i.e., how much redundancy to generate) to encode a particular codeword. In particular, control circuitry 110 may instruct encoder 210 to encode lower order bits with more redundancy than higher order bits of the stored information.

Encoder 210, which is described in more detail in connection with FIG. 3, may use any type of systematic or non-systematic codes, such as BCH codes, to encode the information and generate the codewords. Encoder 210 communicates with the storage device 140 via communications link 212 and stores the codewords that it generates to the storage device 140. It should be understood, that the codewords or redundancy information may be stored in the same or a different memory as the data point information. For example, the data point information retrieved by the receiver may be stored as charges in a flash memory while the redundancy information corresponding to the data point information may be stored in a different memory, such as an SRAM.

In some embodiments, circuitry 130 and encoder 210 may be included as part of receiver 120. In such implementations, the received signal may be encoded by circuitry 130 before it is stored in storage device 140. Including circuitry 130 as part of receiver 120 may increase the efficiency of the system (and prevent errors) because it may not be necessary to store the originally received information to storage device 140 before encoding it. In particular, the information is encoded before it is stored a first time in storage device 140.

For a memory read operation, control circuitry 110 may instruct codeword decoder 230 to read the contents at a particular address from storage device 140. Decoder 230 is coupled via communications link 232 to the storage device 140. Decoder 230 may retrieve the information including the codewords (i.e., redundancy) from the particular memory address and perform a decoding operation to determine in which bit position of a retrieved data point an error occurs. Decoder 230 will be described in more detail in connection with FIG. 4.

Control circuitry 110 may provide the codeword decoder 230 with instructions on how strongly (i.e., how much redundancy to use) to decode a particular codeword that is read from the storage device 140. In particular, control circuitry 110 may instruct decoder 230 to decode lower order bits differently than higher order bits of the stored information.

If the read charge is interpreted to correspond to a digital data point by the decoder 230 that does not match the previously stored information, then a signal level bit error occurs. Decoder 230 may determine whether a signal level bit error occurs by using the redundancy information that is stored in the memory to decode the read data points. Decoder 230 may determine which bit position of a read data point contains an error.

Decoder 230 is coupled to multilevel coset error correction circuitry 240 via communications link 236 and may provide circuitry 240 with the data point and location of the bit error in the data point. Circuitry 240 runs an algorithm and replaces the data point containing the signal level error with a corrected label.

In some embodiments, circuitry 240 steps through coset tree 600 based on the values of the bit positions of the data point containing the bit error. Once the level of the coset tree 600 is reached where the bit position contains the error, the cosets corresponding to that coset level in the tree are retrieved. The circuitry 240 analyzes the labels in the coset (not containing the label that corresponds to the data point) to determine which signal level represented by the labels in the coset is nearest to the signal level represented by the data point containing the error. Circuitry 240 replaces the data point containing the bit error with the label representing the nearest signal level.

Circuitry 240 is coupled to control circuitry 110 via communications link 244 and provides the corrected data point to control circuitry 110 via link 244. In some implementations, circuitry 240 writes the signal level represented by the corrected data point to the previously read memory location containing the error in order to prevent future signal level read errors. Circuitry 240 will be described in more detail in connection with FIGS. 5 and 6.

It should be understood that all of the communication links discussed above and below can be any wired or wireless communication path, such as BLUETOOTH, 802.11a, 802.11b, 802.11g, 802.11i, 802.11n, or any combinations or equivalents thereof. It should also be understood that the term "coupled to" means that a direct or indirect path exists between two or more components.

After receiver 120 stores or writes signal levels of an analog signal to storage device 140, circuitry 130 is instructed to encode the stored information. An encoder in circuitry 130 is used to encode the information stored in the memory according to the coset tree level 600 of the data. In particular, coset tree level 600 may be partitioned according to the bit positions of the stored data and accordingly, the encoder may be instructed to encode a group of bits in one position of each multiple bit data point together.

Figure 3:
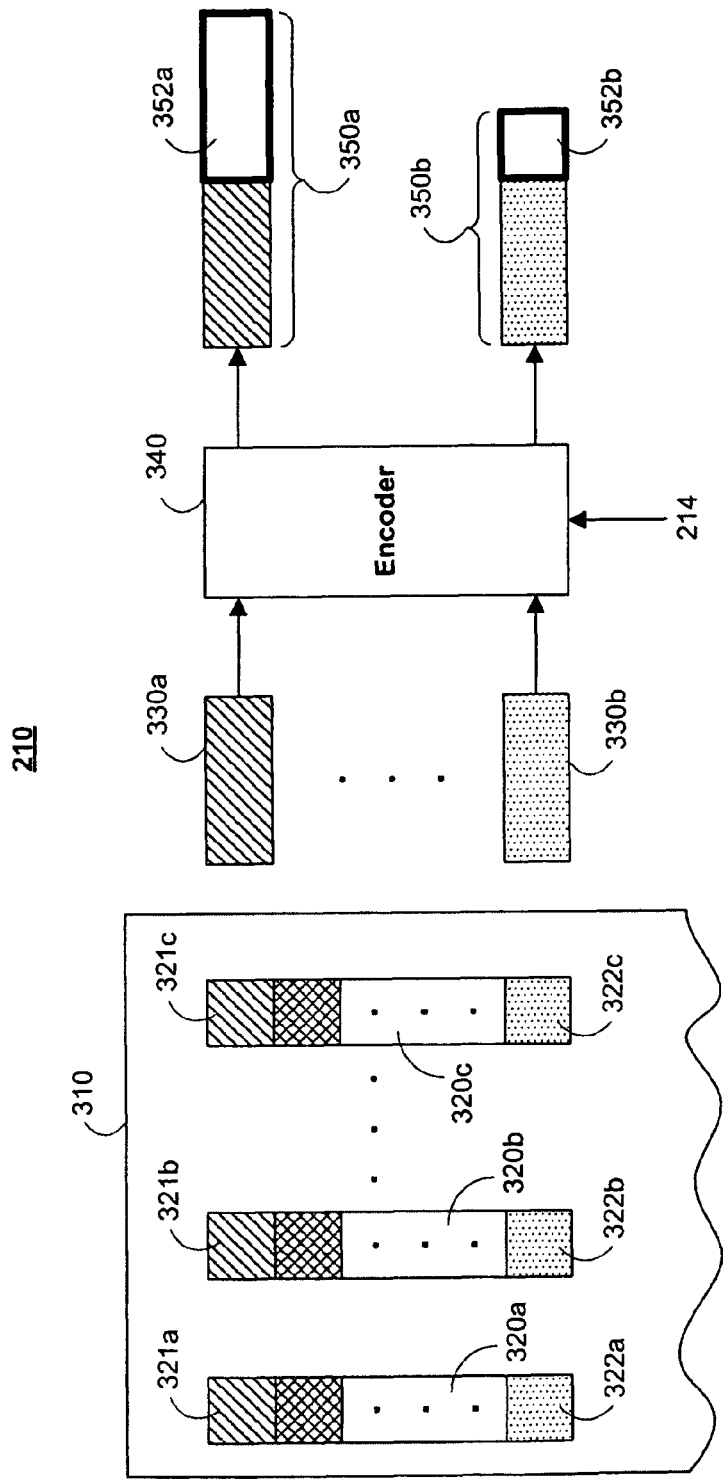
FIG. 3 is a detailed illustration of a multilevel coset encoder in accordance with an embodiment of the present invention.

FIG. 3 is a detailed illustration of a multilevel coset encoder 210 in accordance with an embodiment of the present invention. Coset encoder 210 may obtain a set of user data points. A stored page of data 310 may represent multiple bit digital values for a number of read data points 320*a-c* mapped by coset encoder 210. Each of the multiple bit digital values contain a respective most significant bit position (MSB) 322*a-c* and a respective least significant bit position (LSB) 321*a-c*.

As discussed above, for an 8PAM signal implementation, a coset tree 600 may be formed, where each level of the coset tree 600 is partitioned based on the bit position of a multiple bit data value or point. Thus, as shown in FIG. 6, at the highest level of the tree (which is partitioned based on the LSB of the data points), the cosets contain the most number of labels. Accordingly, it may be desirable to encode the LSB of the digital data points with a stronger level of code (i.e., more redundancy) than the MSB of the digital data points. Similarly, for implementations different from 8PAM signals, it may be desirable to encode the digital values (which may be single or multiple bits in one or more positions) used to partition the coset tree in the higher levels with a stronger level of code than the digital values that partition the coset tree at the lower levels. This is because there is a greater chance of signal level read error in the digital values corresponding to the higher levels of the coset tree than the lower.

Coset encoder 210 groups the bit values of data points in accordance with their position on the coset tree 600. For example, for an 8PAM implementation, coset encoder 210 groups all of the LSB bits 321*a-c* of the read data points 320*a-c* and encodes them together 330*a* using one or more levels of code using encoder 340. The encoder 340 outputs an encoded codeword 350*a* which includes the LSB bits 330*a* and corresponding redundancy information 352*a*. Control circuitry 110 may instruct encoder 340 via communications link 214 with the strength of the code to use on a particular set of data (e.g., LSB bits 330a). Similarly, encoder 340 may encode the MSB bits 330b using the same or a different level of code and output a corresponding codeword 350b. Codeword 350b includes the MSB bits 330b and corresponding redundancy information 352b.

Encoder 340 may implement any systematic or non-systematic code, such as a Hamming code, BCH code, Reed-Solomon Code, Low-density-parity code or any other suitable block code or convolutional code.

Control circuitry 110 may perform a read operation on the storage device 140 and retrieve signal levels stored in the storage device 140. The corresponding digital values and codewords or redundancy information may be passed through circuitry 130 to correct any signal level read errors. A coset decoder may determine which bit position of a particular digital data value or point contains a bit error based on the code used by the encoder (discussed above).

Figure 4:
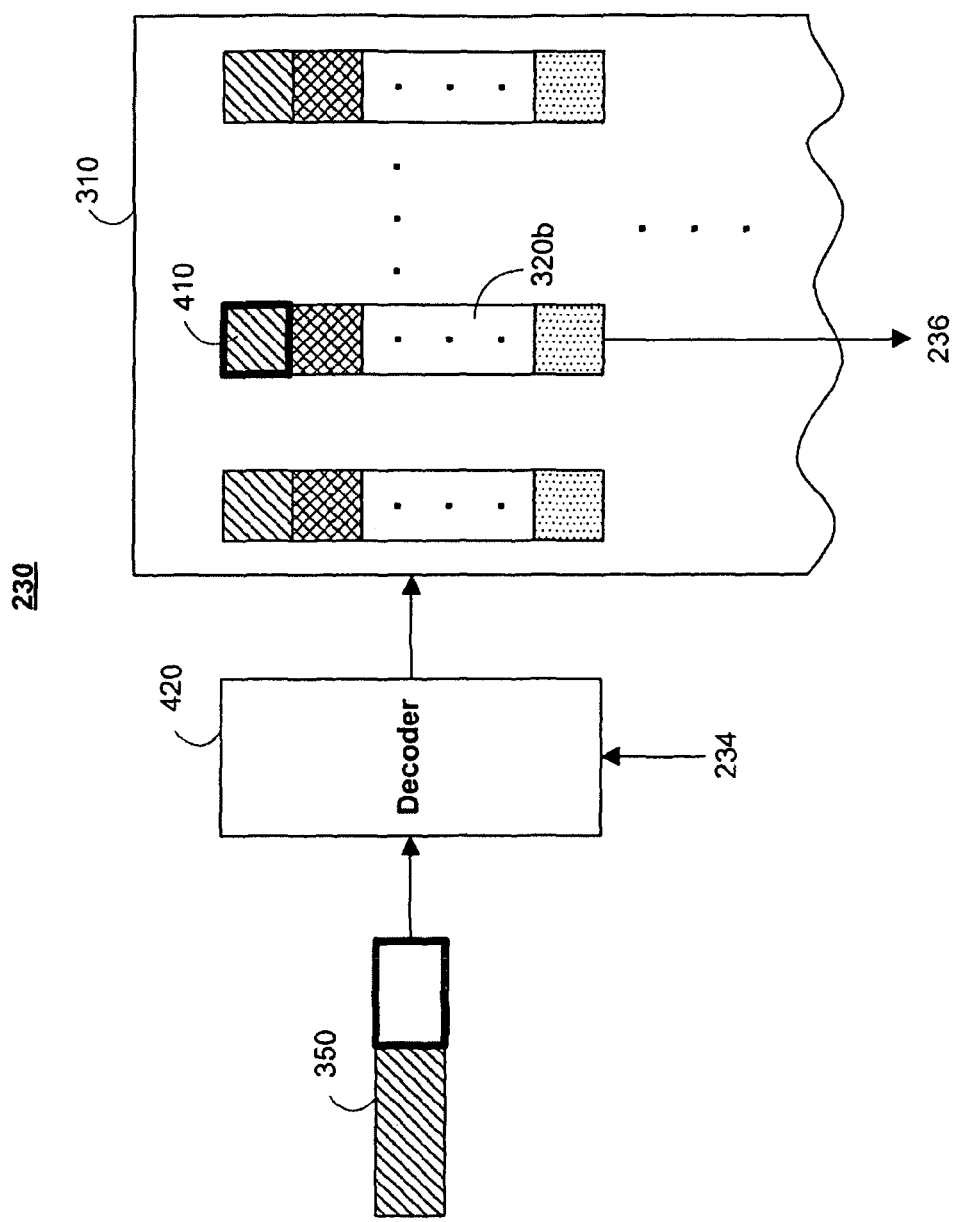
FIG. 4 is a detailed illustration of a multilevel coset decoder in accordance with an embodiment of the present invention.

FIG. 4 is a detailed illustration of a multilevel coset decoder 234 in accordance with an embodiment of the present invention. A digital encoded codeword 350 is passed to coset decoder 234 to determine if a signal level bit error is present in any one of the data points associated with the data bits in the codeword 350. A decoder 420 decodes the encoded codeword using the same code that the encoder used to encode the codeword. Control circuitry 110 provides decoder 420 via communications link 234 with the level of code to use to perform the decoding operation.

For example, codeword 350 may correspond to the encoded LSB bits of a set of multiple bit data points. By decoding the codeword 350, decoder 420 may determine that data point 320b has a bit error 410. In particular, because the codeword 350 corresponds to the LSB bits of data points 320a-c, detecting an error in one of the bits of codeword 350 allows the decoder 420 to determine which bit (i.e., LSB bit) of which data point (e.g., data point 320b) contains an error.

Coset decoder 230 passes the data point with the bit error (e.g., 320b) via communications link 236 to correction circuitry 240 to determine what is the correct value for the data point 320b. As discussed in more detail below in connection with FIG. 5, correction circuitry 240 determines the correct value of the data point based on the cosets in the coset tree 600 and replaces the value of the data point with the error with the correct value.

Figure 5:
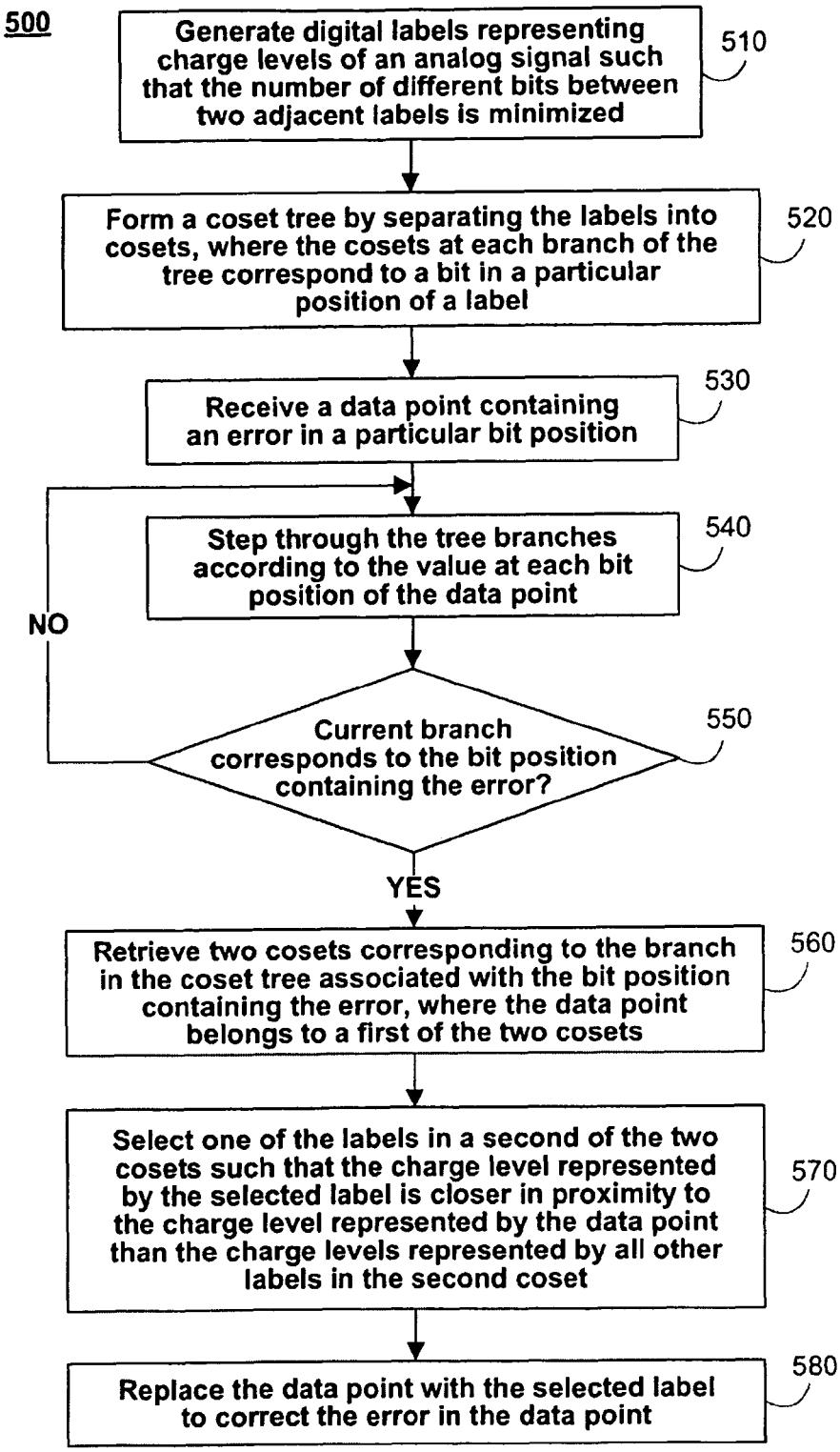
FIG. 5 illustrates a process performed by multilevel coset error correction circuitry in accordance with an embodiment of the present invention.

FIG. 5 illustrates a process 500 performed by multilevel coset error correction circuitry 240 in accordance with an embodiment of the present invention. Correction circuitry 240 begins the process of correcting an error after it receives an instruction from control circuitry 110 and a multiple bit digital value and bit location of the error, but other arrangements are also possible for indicating the error correction process.

At step 510, digital labels representing signal levels of an analog signal are generated such that the number of different bits between two adjacent labels is minimized. This step can be omitted if the digital labels have previously been generated or stored in a memory. Correction circuitry 240 can retrieve the digital labels of the analog signal from a memory. For example, as shown in FIG. 6, coset labels have been generated (or provided by a memory) representing eight distinct signal levels of an analog signal. In particular, the labels represent an 8PAM signal. The labels shown in FIG. 6 are provided such that between any two adjacent labels (e.g., 001 and 011) the number of different bits is minimized. In this particular example, only one bit (i.e., the bit in the second location has changed between the two adjacent labels. Such a labeling may be desirable to reduce bit error ratio (BER).

At step 520, a coset tree 600 is formed by separating or partitioning the labels into cosets such that the cosets at each branch of the coset tree correspond to a bit in a particular position of a label. For example, for an 8PAM analog signal, at the top coset 610 of the coset tree 600 is a collection of all eight coset labels that are to be partitioned. The top coset 610 is next partitioned into two cosets 620 and 630 based on the value of the LSB of the eight cosets. In particular, the coset 620 contains the labels having an LSB with a value of '0' as illustrated by branch 612 while the coset 630 contains the labels having an LSB with a value of '1' as illustrated by branch 614. Each coset 620 and 630 is further partitioned according to the value of the next bit position until all bit positions have been used to partition the labels. In particular, the branches 622 and 624 represent the partition of coset 620 based on the value of the bit in the second position (e.g., for a 3-bit label) and the branches 642 and 644 represent the partition of coset 640 based on the value of the MSB bit (e.g., for a 3-bit label).

It should be noted that such partitioning ensures that in any coset of coset tree 600 after the first partition, the labels in the coset represent signal levels that are separated by more than the minimum distance of the entire constellation (i.e., signal levels are separated by more than the distance between any two adjacent signal levels of the analog signal).

It should be understood that step 520 may be omitted or replaced by retrieving the coset tree 600 that is stored in a memory. Alternatively, circuitry 240 (FIG. 2) may retrieve the labels at a particular coset of the coset tree 600 and coset level by reading one or more memory address where the coset tree 600 is stored.

At step 530, a data point containing an error in a particular bit position is received. For example, codeword decoder 230 decodes the bits in a particular position of multiple data points and determines which data point contains an error in the particular bit position (FIGS. 2 and 4). Decoder 230 provides the data point (e.g., all the bits of the multiple bit data point, such as a 3-bit data point for an 8PAM signal) containing the error in the bit position along with the location of the bit with the error to the correction circuitry 240 via communications link 236.

At step 540, the coset tree branches are stepped through according to the corresponding data point bit value at a particular bit position. For example, for a data point with value "010", the coset tree will be stepped through following the first branch 612 (i.e., the branch representing the value '0' of the LSB bit of the data point).

At step 550, circuitry 240 determines whether the current branch corresponds to the bit position of the data point containing the error. For example, for a data point containing an error in the second bit position, circuitry 240 will return to step 540 to step through the next branch after the first branch 612 and 614 has been processed. After reaching branches 622, 624, 632 or 632 which represent the bit in the second bit position, circuitry 240 will proceed to step 560.

At step 560, two cosets corresponding to the branch in the coset tree 600 associated with the bit position containing the error are retrieved where the data point belongs to a first of the two cosets. Continuing with the example of a data point have the value "010" and an error in the second bit position, circuitry 240 will retrieve cosets 640 and 650 which correspond to the second level of coset tree 600 (i.e., the level associated with the second bit position. The data point having the value "010" belongs to coset 650 since the corresponding branch 624 is associated with the value '1' for the bit in the second position.

At step 570, one of the labels in a second one of the two cosets is selected such that the signal level represented by the selected label is closer in proximity to the signal level represented by the data point than the signal levels represented by all other labels in the second coset. Continuing with the above example, the second coset 640 (i.e., the coset which the data point does not belong to) includes labels 000 and 100 which may represent, for example, signal levels −1 Volt and 0 Volts respectively and data point 010 may represent signal level −0.25 Volts. Circuitry 240 compares the signal levels represented by the labels in the second coset with the signal level represented by the data point with the error and select the label that represents the signal level that is closest in proximity. In particular, circuitry 240 selects label 100 since it may represent a signal level (i.e., 0 Volts) that is closer in proximity to −0.25 Volts than label 000 which may represent signal level −1 Volt.

At step 580, the data point is replaced with the selected label to correct the bit error in the data point. For example, circuitry 240 replaces data point 010 with the correct value of 100 and provides the corrected value to the control circuit 110.

In an 8PAM implementation, circuitry 240 may include a look-up table with labels to replace data points that contain errors in particular bit positions. Such a look-up table allows circuitry 240 to retrieve the corrected value without stepping through a coset tree 600 and comparing signal level values. For example, when an error is determined to be in the LSB bit of a data point, circuitry 240 will change the value of the LSB bit and output the modified data point as the corrected data point value. In particular, for a data point having a value of "100" and an error in the LSB bit, circuitry 240 outputs "101" as the corrected value. Similarly, when an error is determined to be in the MSB bit of a data point, circuitry 240 will change the value of the MSB bit and output the modified data point as the corrected data point value. In particular, for a data point having a value of "100" and an error in the MSB bit, circuitry 240 outputs "000" as the corrected value.

When an error is determined to be in the second bit position of a data point (e.g., for an 8PAM implementation), circuitry 240 replaces the data point with the values (provided by a look-up table) as follows (where the data point on the left part of the arrow represents the value to be replaced by the right part of the arrow):

000→010, 100→010, 010→100, 110→100 001→011, 101→111, 011→001, 111→101 assuming the 8PAM signal is labeled as shown in FIG. 6.

It should be understood that the above described encoding/decoding and error correction scheme is applicable to any multidimensional constellation (i.e., analog signal having multiple data values represented by signal levels), where the signal constellation consists of the Cartesian product of three 8PAM constellations. Specifically, the Cartesian product of two sets X (e.g., the points on an x-axis) and Y (e.g., the points on a y-axis), denoted X×Y, being the set of all possible ordered pairs whose first component is a member of X and whose second component is a member of Y (e.g., the entire signal space on the x-y plane):

X×Y={(x,y)|x∈X and y∈Y}.

For example, for a 3×8 PAM multidimensional constellation, a signal point may consist of 3 components, represented by (x,y,z) and each component (e.g., x component) comes from an independent 8PAM signal. The presented scheme can be extended to such spaces. Additionally, nonbinary partitioning schemes can be used. Furthermore, Euclidean distances may be used to measure proximity of a sample difference in two scalar values in the one dimensional case.

Referring now to FIGS. 7A-7G, various exemplary implementations of the present invention are shown.

Figure 7A:
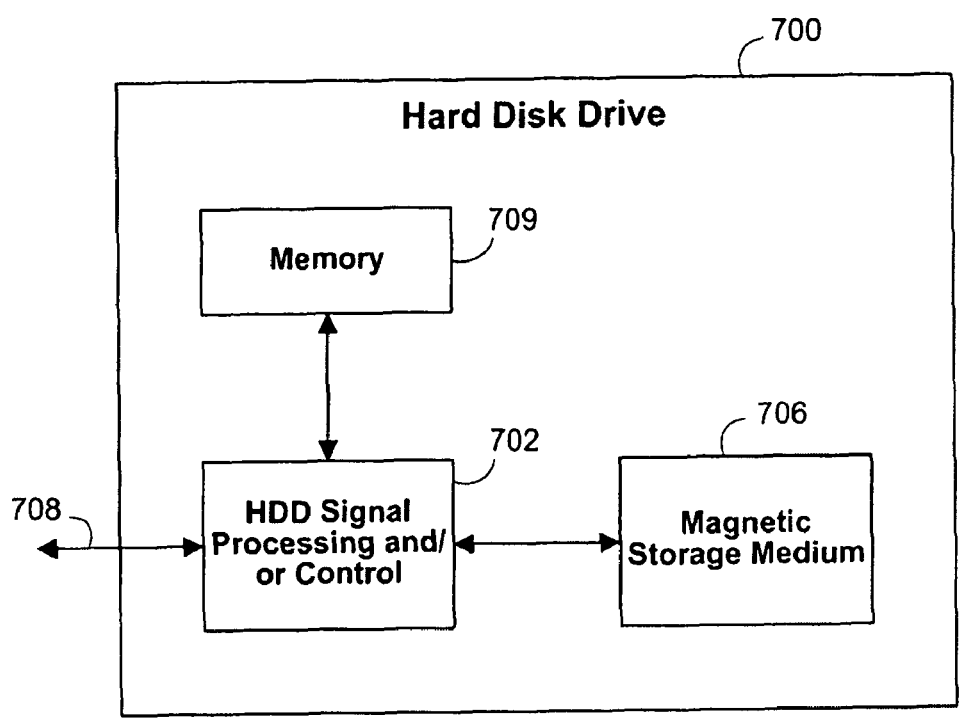
FIG. 7A is a block diagram of an exemplary hard disk drive that can employ the disclosed technology.

Referring now to FIG. 7A, the present invention can be implemented in a hard disk drive (HDD) 700. The present invention may implement either or both signal processing and/or control circuits, which are generally identified in FIG. 7A at 702. In some implementations, the signal processing and/or control circuit 702 and/or other circuits (not shown) in the HDD 700 may process data, perform coding and/or encryption, perform calculations, and/or format data that is output to and/or received from a magnetic storage medium 706.

The HDD 700 may communicate with a host device (not shown) such as a computer, mobile computing devices such as personal digital assistants, cellular phones, media or MP3 players and the like, and/or other devices via one or more wired or wireless communication links 708. The HDD 700 may be connected to memory 709 such as random access memory (RAM), low latency nonvolatile memory such as flash memory, read only memory (ROM) and/or other suitable electronic data storage.

Figure 7B:
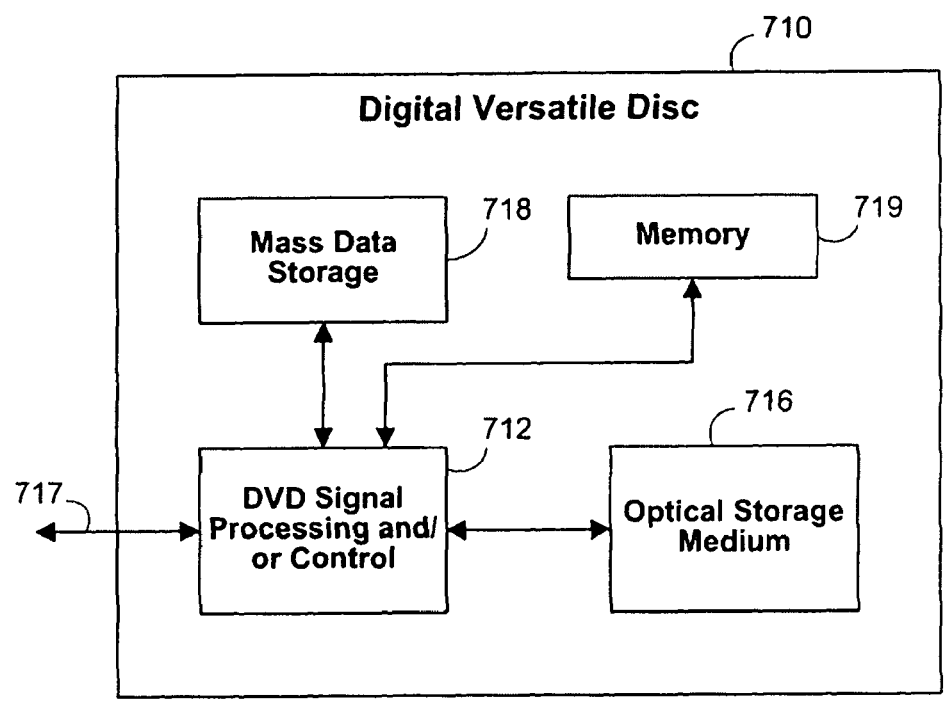
FIG. 7B is a block diagram of an exemplary digital versatile disc that can employ the disclosed technology.

Referring now to FIG. 7B, the present invention can be implemented in a digital versatile disc (DVD) drive 710. The present invention may implement either or both signal processing and/or control circuits, which are generally identified in FIG. 7B at 712, and/or mass data storage 718 of the DVD drive 710. The signal processing and/or control circuit 712 and/or other circuits (not shown) in the DVD 710 may process data, perform coding and/or encryption, perform calculations, and/or format data that is read from and/or data written to an optical storage medium 716. In some implementations, the signal processing and/or control circuit 712 and/or other circuits (not shown) in the DVD 710 can also perform other functions such as encoding and/or decoding and/or any other signal processing functions associated with a DVD drive.

The DVD drive 710 may communicate with an output device (not shown) such as a computer, television or other device via one or more wired or wireless communication links 717. The signal processing and/or control circuit 712 may communicate with mass data storage 718 that stores data in a nonvolatile manner. The mass data storage 718 may include a hard disk drive (HDD). The HDD 700 may have the configuration shown in FIG. 7A. The HDD 700 may be a mini HDD that includes one or more platters having a diameter that is smaller than approximately 1.8". The DVD 710 may be connected to memory 719 such as RAM, ROM, low latency nonvolatile memory such as flash memory and/or other suitable electronic data storage.

Figure 7C:
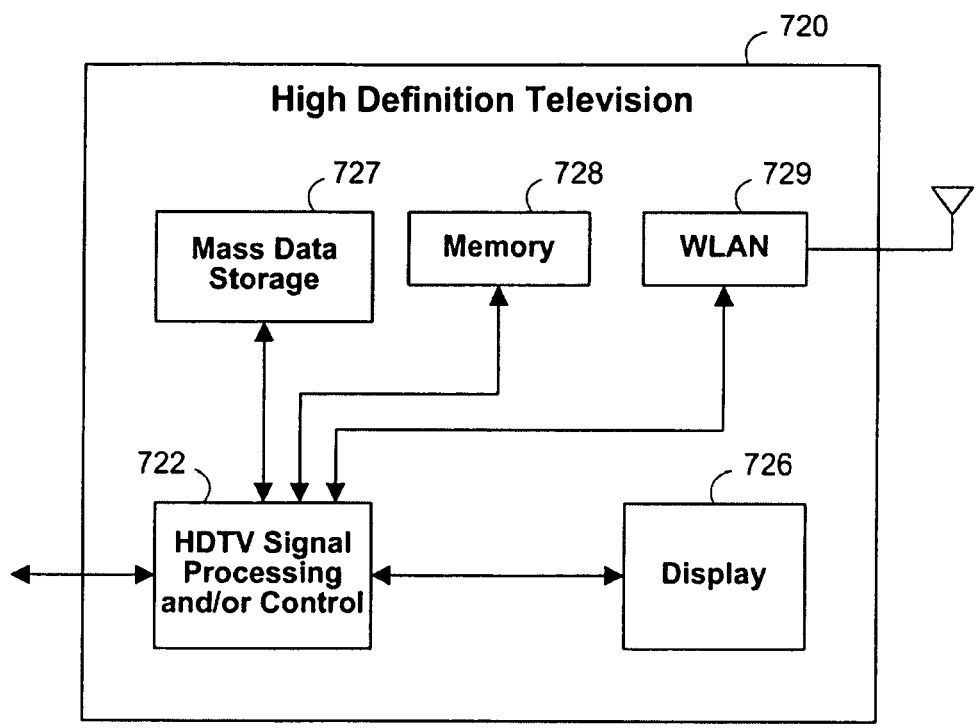
FIG. 7C is a block diagram of an exemplary high definition television that can employ the disclosed technology.

Referring now to FIG. 7C, the present invention can be implemented in a high definition television (HDTV) 720. The present invention may implement either or both signal processing and/or control circuits, which are generally identified in FIG. 7C at 722, a WLAN interface and/or mass data storage of the HDTV 720. The HDTV 720 receives HDTV input signals in either a wired or wireless format and generates HDTV output signals for a display 726. In some implementations, signal processing circuit and/or control circuit 722 and/or other circuits (not shown) of the HDTV 720 may process data, perform coding and/or encryption, perform calculations, format data and/or perform any other type of HDTV processing that may be required.

The signal processing and/or control circuit 722 may communicate with mass data storage 727 that stores data in a nonvolatile manner such as optical and/or magnetic storage devices for example hard disk drives HDD and/or DVDs. At least one HDD may have the configuration shown in FIG. 7A and/or at least one DVD may have the configuration shown in FIG. 7B. The HDD may be a mini HDD that includes one or more platters having a diameter that is smaller than approximately 1.8". The HDTV 720 may be connected to memory 728 such as RAM, ROM, low latency nonvolatile memory such as flash memory and/or other suitable electronic data storage. The HDTV 720 also may support connections with a WLAN via a WLAN network interface 729.

Figure 7D:
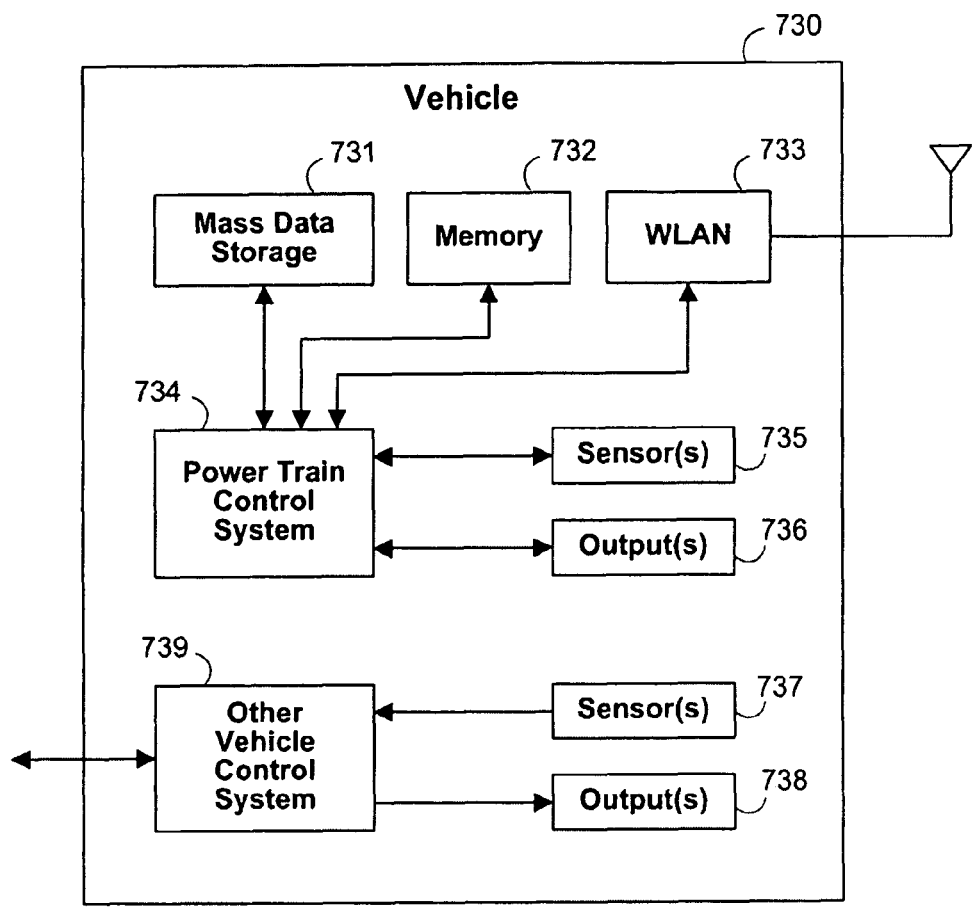
FIG. 7D is a block diagram of an exemplary vehicle that can employ the disclosed technology.

Referring now to FIG. 7D, the present invention implements a control system of a vehicle 730, a WLAN interface and/or mass data storage of the vehicle control system. In some implementations, the present invention may implement a powertrain control system 734 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be implemented in other control systems 739 of the vehicle 730. The control system 739 may likewise receive signals from input sensors 737 and/or output control signals to one or more output devices 738. In some implementations, the control system 739 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 734 may communicate with mass data storage 731 that stores data in a nonvolatile manner. The mass data storage 731 may include optical and/or magnetic storage devices for example hard disk drives HDD and/or DVDs. At least one HDD may have the configuration shown in FIG. 7A and/or at least one DVD may have the configuration shown in FIG. 7B. The HDD may be a mini HDD that includes one or more platters having a diameter that is smaller than approximately 1.8". The powertrain control system 734 may be connected to memory 732 such as RAM, ROM, low latency nonvolatile memory such as flash memory and/or other suitable electronic data storage. The powertrain control system 734 also may support connections with a WLAN via a WLAN network interface 733. The control system 739 may also include mass data storage, memory and/or a WLAN interface (all not shown).

Figure 7E:
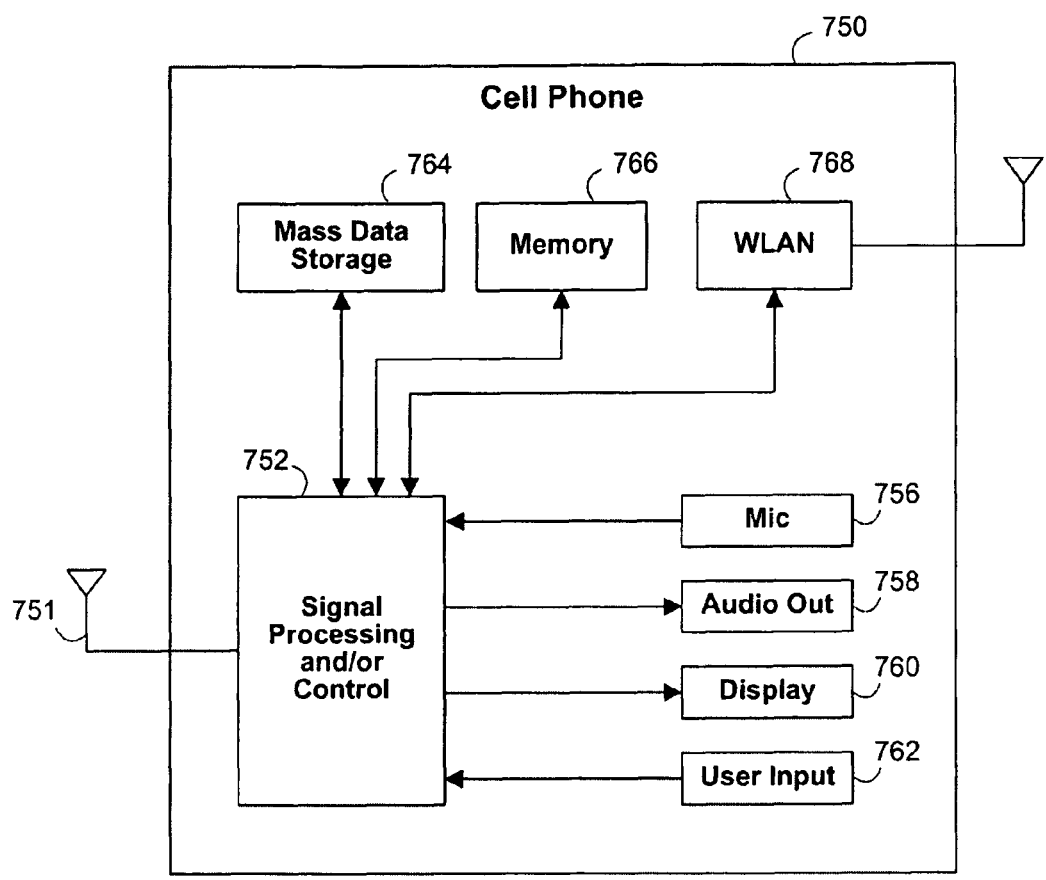
FIG. 7E is a block diagram of an exemplary cell phone that can employ the disclosed technology.

Referring now to FIG. 7E, the present invention can be implemented in a cellular phone 750 that may include a cellular antenna 751. The present invention may implement either or both signal processing and/or control circuits, which are generally identified in FIG. 7E at 752, a WLAN interface and/or mass data storage of the cellular phone 750. In some implementations, the cellular phone 750 includes a microphone 756, an audio output 758 such as a speaker and/or audio output jack, a display 760 and/or an input device 762 such as a keypad, pointing device, voice actuation and/or other input device. The signal processing and/or control circuits 752 and/or other circuits (not shown) in the cellular phone 750 may process data, perform coding and/or encryption, perform calculations, format data and/or perform other cellular phone functions.

The signal processing and/or control circuits 752 in the cellular phone 750 may communicate with mass data storage 764 that stores data in a nonvolatile manner such as optical and/or magnetic storage devices for example hard disk drives HDD and/or DVDs. At least one HDD may have the configuration shown in FIG. 7A and/or at least one DVD may have the configuration shown in FIG. 7B. The HDD may be a mini HDD that includes one or more platters having a diameter that is smaller than approximately 1.8". The cellular phone 750 may be connected to memory 766 such as RAM, ROM, low latency nonvolatile memory such as flash memory and/or other suitable electronic data storage. The cellular phone 750 also may support connections with a WLAN via a WLAN network interface 768.

Figure 7F:
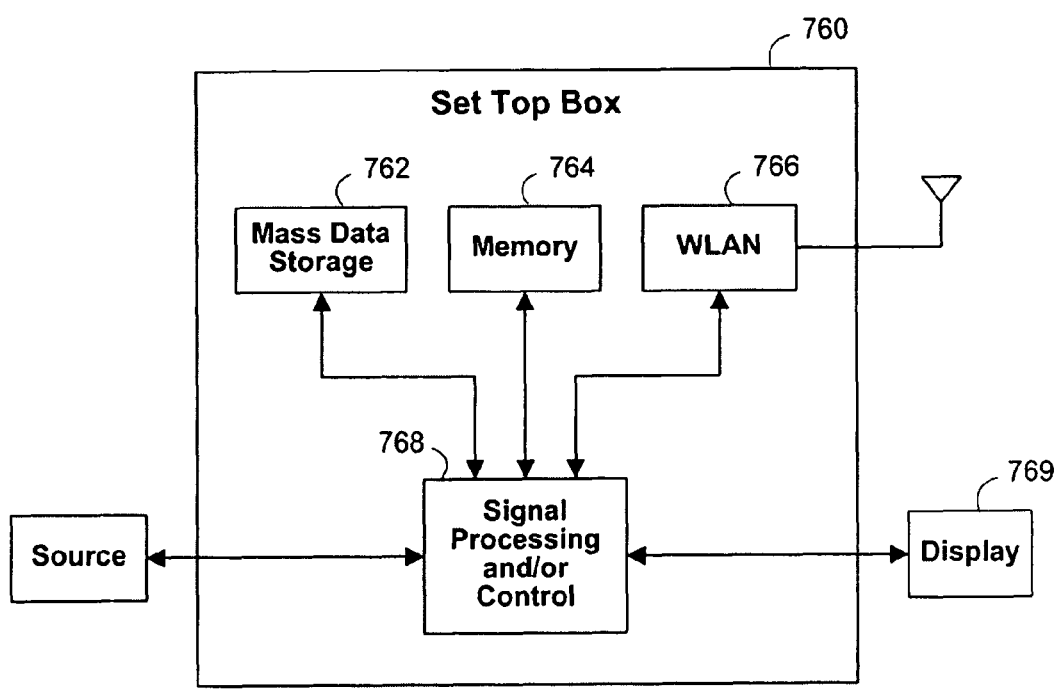
FIG. 7F is a block diagram of an exemplary set top box that can employ the disclosed technology.

Referring now to FIG. 7F, the present invention can be implemented in a set top box 760. The present invention may implement either or both signal processing and/or control circuits, which are generally identified in FIG. 7F at 768, a WLAN interface and/or mass data storage of the set top box 760. The set top box 760 receives signals from a source such as a broadband source and outputs standard and/or high definition audio/video signals suitable for a display 769 such as a television and/or monitor and/or other video and/or audio output devices. The signal processing and/or control circuits 768 and/or other circuits (not shown) of the set top box 760 may process data, perform coding and/or encryption, perform calculations, format data and/or perform any other set top box function.

The signal processing and/or control circuits 768 may communicate with mass data storage 762 that stores data in a nonvolatile manner. The mass data storage 762 may include optical and/or magnetic storage devices for example hard disk drives HDD and/or DVDs. At least one HDD may have the configuration shown in FIG. 7A and/or at least one DVD may have the configuration shown in FIG. 7B. The HDD may be a mini HDD that includes one or more platters having a diameter that is smaller than approximately 1.8". The set top box 760 may be connected to memory 764 such as RAM, ROM, low latency nonvolatile memory such as flash memory and/or other suitable electronic data storage. The set top box 760 also may support connections with a WLAN via a WLAN network interface 766.

Figure 7G:
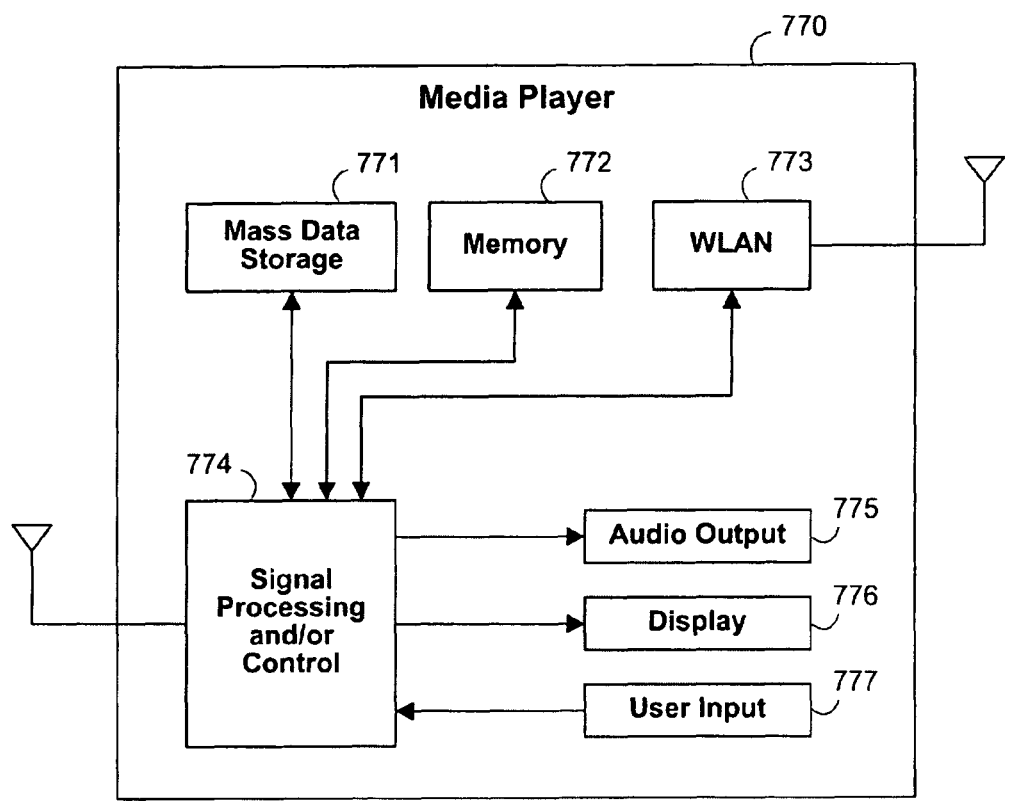
FIG. 7G is a block diagram of an exemplary media player that can employ the disclosed technology.

Referring now to FIG. 7G, the present invention can be implemented in a media player 770. The present invention may implement either or both signal processing and/or control circuits, which are generally identified in FIG. 7G at 774, a WLAN interface and/or mass data storage of the media player 770. In some implementations, the media player 770 includes a display 776 and/or a user input 777 such as a keypad, touchpad and the like. In some implementations, the media player 770 may employ a graphical user interface (GUI) that typically employs menus, drop down menus, icons and/or a point-and-click interface via the display 776 and/or user input 777. The media player 770 further includes an audio output 775 such as a speaker and/or audio output jack. The signal processing and/or control circuits 774 and/or other circuits (not shown) of the media player 770 may process data, perform coding and/or encryption, perform calculations, format data and/or perform any other media player function.

The signal processing and/or control circuits 774 may communicate with mass data storage 771 that stores data such as compressed audio and/or video content in a nonvolatile manner. In some implementations, the compressed audio files include files that are compliant with MP3 format or other suitable compressed audio and/or video formats. The mass data storage 771 may include optical and/or magnetic storage devices for example hard disk drives HDD and/or DVDs. At least one HDD may have the configuration shown in FIG. 7A and/or at least one DVD may have the configuration shown in FIG. 7B. The HDD may be a mini HDD that includes one or more platters having a diameter that is smaller than approximately 1.8". The media player 770 may be connected to memory 772 such as RAM, ROM, low latency nonvolatile memory such as flash memory and/or other suitable electronic data storage. The media player 770 also may support connections with a WLAN via a WLAN network interface 773. Still other implementations in addition to those described above are contemplated.

The foregoing describes systems and methods providing multilevel coset coding and probabilistic error correction. The above described embodiments of the present invention are presented for the purposes of illustration and not of limitation. Furthermore, the present invention is not limited to a particular implementation. The invention may be implemented in hardware, such as on an application specific integrated circuit (ASIC) or on a field-programmable gate array (FPGA). The invention may also be implemented in software.

What is claimed is:

1. A method for coding data stored in a plurality of memory cells, wherein each of the cells stores a signal level, wherein each unique signal level corresponds to at least one different data point, the method comprising:
    detecting, using control circuitry, an error in a first data point;
    selecting, based on a coset of data points, a second data point, wherein the selected second data point represents a signal level that is closer in proximity to the signal level represented by the first data point than a signal level represented by another data point in the coset; and
    correcting the error.

2. The method of claim 1, further comprising determining a first coset to which the first data point belongs, wherein the first coset includes data points that represent non-adjacent signal levels.

3. The method of claim 1, wherein the selected second data point represents a signal level that is closer in proximity to the signal level represented by the first data point than the signal levels represented by all other data points in the coset.

4. The method of claim 1, wherein correcting the error comprises replacing the first data point with the second data point.

5. The method of claim 1 further comprising:
    forming a first codeword corresponding to a first position of one or more of the bits of the data point by combining at least one bit in the first position of one data point with a corresponding at least one bit in the first position of another data point;
    encoding the first codeword; and
    decoding the first codeword to detect an error in the first bit position of one of the data points.

6. The method of claim 5 wherein detecting the error further comprises determining which data point has the error.

7. The method of claim 5 further comprising:
    forming a second codeword corresponding to a second position of one or more of the bits of the data point by combining at least one bit in the second position of one data point with a corresponding at least one bit in the second position of another data point; and
    encoding the second codeword.

8. The method of claim 7 further comprising decoding the second codeword to detect an error in the second position of one of the data points.

9. The method of claim 7 wherein the first codeword and second codeword are encoded using codes with different redundancy information.

10. The method of claim 9 wherein the first codeword is encoded using a code that generates more redundancy information than the code used to encode the second codeword.

11. The method of claim 1 further comprising:
    generating a coset tree comprising a plurality of levels of cosets of data points that represent subsets of the entire signal level space, wherein each level corresponds to different bit positions of the data point, wherein at least two cosets are in a first of the levels corresponding to a first bit position of the data point, and wherein each of the first level cosets are further divided into a plurality of cosets at subsequent levels according to subsequent bit positions of the data point;
    wherein when an error is detected in the first bit position of the first data point, cosets in the first coset level are analyzed to determine to which coset in the first level the first data point with the error belongs in order to select the second data point from another coset of the at least two cosets in the first level to replace the first data point with the error.

12. The method of claim 11 further comprising using cosets in a second coset tree level to correct an error in a second bit position of the second data point.

13. The method of claim 11 wherein the first level cosets are divided according to a value of at least one bit in the first bit position and wherein the cosets in the subsequent levels are divided according to values of bits in respective bit positions.

14. The method of claim 11 wherein an analog signal of the data point is a pulse amplitude modulated signal having eight digital values (8PAM) and wherein there are three coset levels in the coset tree.

15. The method of claim 1 wherein the data point is a multi-dimensional data point having a plurality of components such that each unique signal level corresponds to two or more data point component signal values.

16. A system for coding data stored in a plurality of memory cells, wherein each of the cells stores a signal level, wherein each unique signal level corresponds to at least one different data point, the system configured to:
    detect an error in a first data point;
    select, based on a coset of data points, a second data point, wherein the selected second data point represents a signal level that is closer in proximity to the signal level represented by the first data point than a signal level represented by another data point in the coset; and
    correct the error.

17. The system of claim 16 wherein the system is further configured to determine a first coset to which the first data point belongs, wherein the first coset includes data points that represent non-adjacent signal levels.

18. The system of claim 16 wherein the selected second data point represents a signal level that is closer in proximity to the signal level represented by the first data point than the signal levels represented by all other data points in the coset.

19. The system of claim 16 wherein the system is further configured to replace the first data point with the second data point to correct the error.

20. The system of claim 16 further comprising:
    an encoder configured to:
        form a first codeword corresponding to a first position of one or more of the bits of the data point by combining at least one bit in the first position of one data point with a corresponding at least one bit in the first position of another data point; and
        encode the first codeword; and
    a decoder configured to:
        decode the first codeword to detect an error in the first bit position of one of the data points.

21. The system of claim 20 wherein the decoder is further configured to determine which data point has the error.

22. The system of claim 20 wherein:
    the encoder is further configured to:

form a second codeword corresponding to a second position of one or more of the bits of the data point by combining at least one bit in the second position of one data point with a corresponding at least one bit in the second position of another data point; and
encode the second codeword.

23. The system of claim 22 wherein the decoder is further configured to decode the second codeword to detect an error in the second position of one of the data points.

24. The system of claim 22 wherein the first codeword and second codeword are encoded using codes with different redundancy information.

25. The system of claim 24 wherein the first codeword is encoded using a code that generates more redundancy information than the code used to encode the second codeword.

26. The system of claim 16 wherein the control circuitry is further configured to:
generate a coset tree comprising a plurality of levels of cosets of data points that represent subsets of the entire signal level space, wherein each level corresponds to different bit positions of the data point, wherein at least two cosets are in a first of the levels corresponding to a first bit position of the data point, and wherein each of the first level cosets are further divided into a plurality of cosets at subsequent levels according to subsequent bit positions of the data point;
wherein when an error is detected in the first bit position of the first data point, cosets in the first coset level are analyzed to determine to which coset in the first level the first data point with the error belongs in order to select the second data point from another coset of the at least two cosets in the first level to replace the first data point with the error.

27. The system of claim 26 wherein the system is further configured to use cosets in a second coset tree level to correct an error in a second bit position of the second data point.

28. The system of claim 26 wherein the first level cosets are divided according to a value of at least one bit in the first position and wherein the cosets in the subsequent levels are divided according to values of bits in respective bit positions.

29. The system of claim 26 wherein an analog signal of the data point is a pulse amplitude modulated signal having eight digital values (8PAM) and wherein there are three coset levels in the coset tree.

30. The system of claim 16 wherein the data point is a multi-dimensional data point having a plurality of components such that each unique signal level corresponds to two or more data point component signal values.

* * * * *